US010192970B1

(12) United States Patent
Okojie

(10) Patent No.: US 10,192,970 B1
(45) Date of Patent: Jan. 29, 2019

(54) SIMULTANEOUS OHMIC CONTACT TO SILICON CARBIDE

(71) Applicant: The United States of America as represented by the Administrator of the National Aeronautics and Space Administration, Washington, DC (US)

(72) Inventor: Robert S. Okojie, Strongsville, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 72 days.

(21) Appl. No.: 14/456,015

(22) Filed: Aug. 11, 2014

Related U.S. Application Data

(60) Provisional application No. 61/883,419, filed on Sep. 27, 2013.

(51) Int. Cl.
| | |
|---|---|
| H01L 29/45 | (2006.01) |
| H01L 21/44 | (2006.01) |
| H01L 21/28 | (2006.01) |
| H01L 21/24 | (2006.01) |
| H01L 29/16 | (2006.01) |
| H01L 21/285 | (2006.01) |
| H01L 21/3213 | (2006.01) |
| H01L 21/324 | (2006.01) |
| H01L 29/786 | (2006.01) |
| H01L 21/02 | (2006.01) |
| H01L 21/04 | (2006.01) |

(52) U.S. Cl.
CPC ........ *H01L 29/45* (2013.01); *H01L 21/02378* (2013.01); *H01L 21/02447* (2013.01); *H01L 21/02529* (2013.01); *H01L 21/0485* (2013.01); *H01L 21/2855* (2013.01); *H01L 21/28518* (2013.01); *H01L 21/28568* (2013.01); *H01L 21/324* (2013.01); *H01L 21/32133* (2013.01); *H01L 21/32139* (2013.01); *H01L 29/1608* (2013.01); *H01L 29/78684* (2013.01)

(58) Field of Classification Search
CPC . H01L 21/0485; H01L 29/1608; H01L 29/45; H01L 29/78684; H01L 21/28518; H01L 21/2855; H01L 21/28568; H01L 21/02167; H01L 21/8213; H01L 2924/04642; H01L 2924/10272; H01L 21/02378; H01L 21/02447; H01L 21/02529
USPC .............................................. 257/77; 438/602
See application file for complete search history.

(56) References Cited

U.S. PATENT DOCUMENTS

| | | | | | |
|---|---|---|---|---|---|
| 3,658,489 | A | * | 4/1972 | Ishikawa | ................. H01L 21/00 257/766 |
| 4,023,993 | A | * | 5/1977 | Scifres | ................ H01L 33/0025 148/33.5 |
| 5,691,593 | A | * | 11/1997 | Takeuchi | ............. B41J 2/14233 310/324 |

(Continued)

*Primary Examiner* — Marvin Payen
*Assistant Examiner* — Jeremy Joy
(74) *Attorney, Agent, or Firm* — Robert H. Earp, III; William M. Johnson

(57) ABSTRACT

A simultaneous ohmic contact to silicon carbide includes a mixture of platinum, titanium, and silicon compounds deposited on a silicon carbide substrate. The silicon carbide substrate includes an n-type surface and a p-type surface.

19 Claims, 12 Drawing Sheets

(56) References Cited

U.S. PATENT DOCUMENTS

| | | | |
|---|---|---|---|
| 5,920,794 A * | 7/1999 | Hong | H01L 21/76838 257/E21.582 |
| 6,297,138 B1 * | 10/2001 | Rimai | C23C 14/16 257/E21.066 |
| 6,373,076 B1 * | 4/2002 | Alok | H01L 21/0445 257/109 |
| 6,410,460 B1 * | 6/2002 | Shalish | H01L 21/048 257/E21.061 |
| 6,468,890 B2 | 10/2002 | Bartsch et al. | |
| 6,470,039 B1 * | 10/2002 | Ukita | B82Y 20/00 372/46.01 |
| 6,577,006 B1 * | 6/2003 | Oota | H01L 21/28575 257/745 |
| 6,599,644 B1 * | 7/2003 | Zekentes | H01L 21/0485 257/750 |
| 6,759,683 B1 * | 7/2004 | Cole | H01L 21/0485 257/198 |
| 6,900,477 B1 * | 5/2005 | Shah | H01L 29/744 257/107 |
| 7,163,882 B1 | 1/2007 | Cole et al. | |
| 7,790,616 B2 | 9/2010 | Buchoff et al. | |
| 7,875,545 B2 | 1/2011 | Ward, III et al. | |
| 8,373,175 B1 * | 2/2013 | Okojie | H01L 21/0485 257/77 |
| 8,519,410 B1 * | 8/2013 | Odekirk | H01L 29/66068 257/256 |
| 8,920,679 B2 * | 12/2014 | Clough | C07F 7/081 252/500 |
| 9,318,440 B2 * | 4/2016 | Cao | H01L 23/5329 |
| 10,056,259 B1 * | 8/2018 | Okojie | H01L 21/0485 |
| 2001/0032493 A1 * | 10/2001 | Samman | G01N 27/129 73/31.06 |
| 2002/0093020 A1 * | 7/2002 | Edmond | B82Y 20/00 257/79 |
| 2003/0040144 A1 * | 2/2003 | Blanchard | H01L 29/7813 438/145 |
| 2003/0138669 A1 * | 7/2003 | Kojima | G11B 7/2403 428/64.4 |
| 2006/0237728 A1 * | 10/2006 | Ryu | H01L 21/049 257/77 |
| 2008/0116464 A1 * | 5/2008 | Ward, III | H01L 21/0485 257/77 |
| 2009/0057906 A1 * | 3/2009 | Buchoff | H01L 21/0485 257/754 |
| 2009/0267096 A1 * | 10/2009 | Kim | H01L 33/0079 257/98 |
| 2010/0258894 A1 * | 10/2010 | Inada | H01L 27/1463 257/443 |
| 2011/0031507 A1 * | 2/2011 | Tamaso | H01L 21/0485 257/77 |
| 2011/0031567 A1 * | 2/2011 | Corona | B81C 1/00047 257/419 |
| 2011/0233689 A1 * | 9/2011 | Hata | H01L 29/045 257/411 |
| 2012/0217591 A1 * | 8/2012 | Kamada | H01L 23/53223 257/410 |
| 2012/0326263 A1 * | 12/2012 | Yang | H01L 29/417 257/499 |
| 2014/0061675 A1 * | 3/2014 | Watanabe | H01L 29/66068 257/77 |
| 2014/0219063 A1 * | 8/2014 | Hajati | B06B 1/0292 367/157 |
| 2015/0028391 A1 * | 1/2015 | Takahashi | H01L 29/205 257/195 |

* cited by examiner

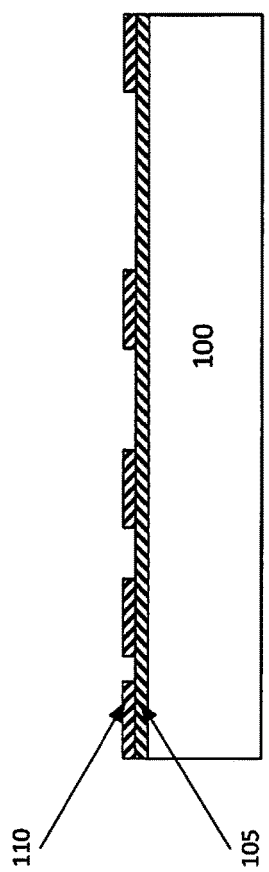

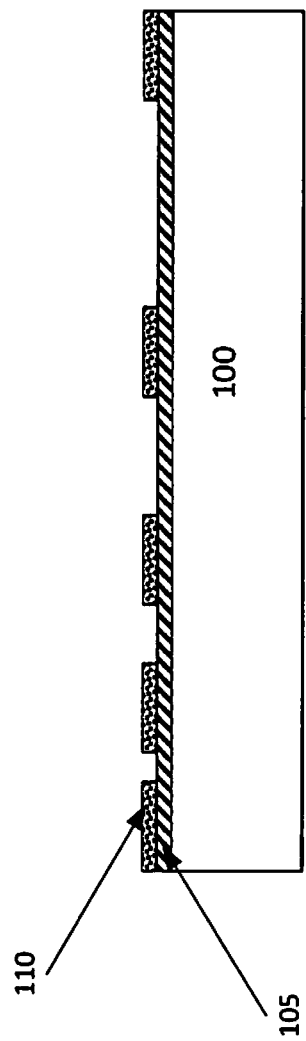

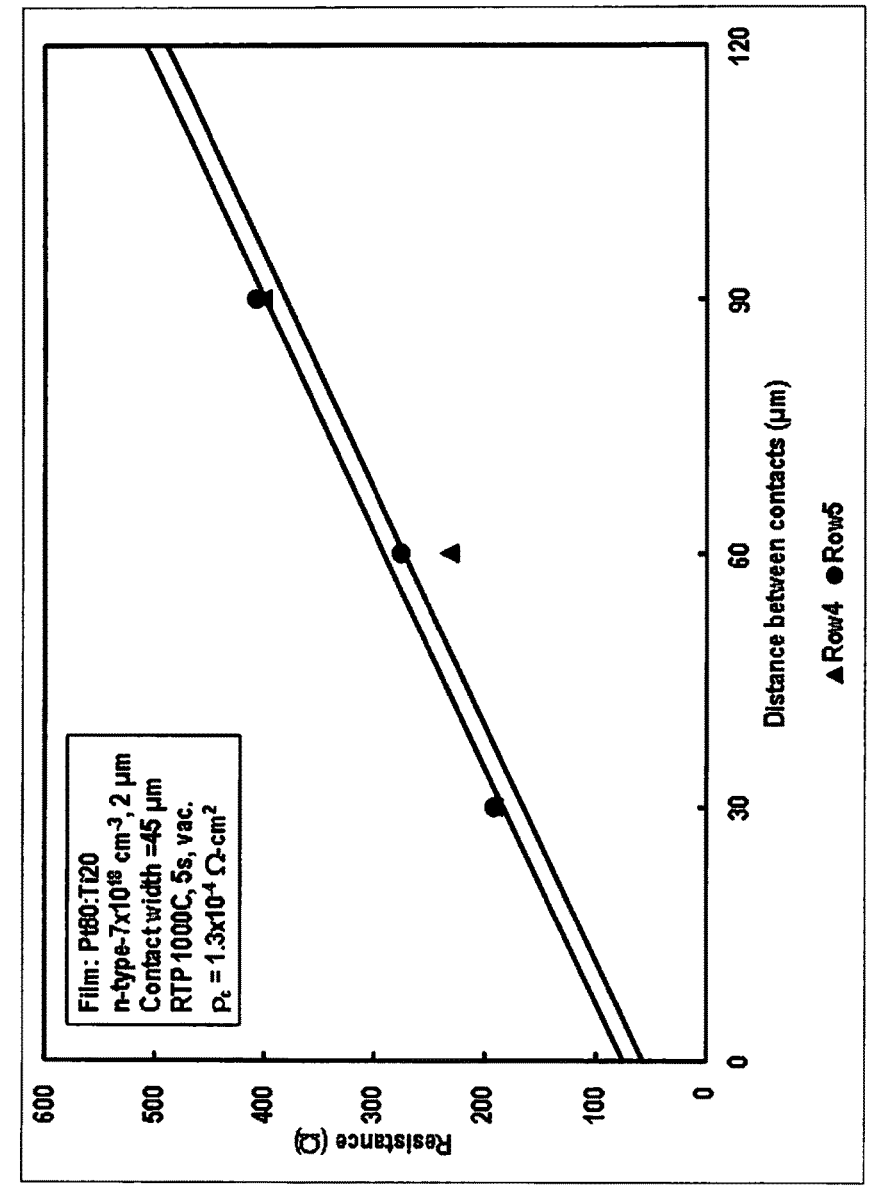

| Pt-Ti Ratios | Samples | As Deposit | 800 °C | 900 °C | 1000 °C | 1100 °C | 1200 °C |
|---|---|---|---|---|---|---|---|
| Pt | 1, DH0852-17 (p-type 2e19, 3.1 μm) | R | R | R | R | R | R |
|  | 2, DH0852-12 (p-type 7e19, 2 μm) | R | R | R | R | R | R |
|  | 3, DH0852-19 (p-type 2.5e20, 0.5 μm) | O | O | O | O | O | O |
|  | 4, BQ0555-06 (n-type 7e18), 2 μm | R | R | R | R | O | O |
| Pt(80):Ti(20) | 5, DH0852-17 (p-type 2e19, 3.1 μm) | R | R | R | R | R | R |
|  | 6, DH0852-12 (p-type 7e19, 2 μm) | R | R | R | R | R | R |
|  | 7, DH0852-19 (p-type 2.5e20, 0.5 μm) | WO | O | O | O | O | O |
|  | 8, BQ0555-06 (n-type 7e18), 2 μm | R | R | R | O | WO | O |
| Pt(50):Ti(50) | 9, DH0852-17 (p-type 2e19, 3.1 μm) | R | R | R | R | R | R |
|  | 10, DH0852-12 (p-type 7e19, 2 μm) | R | R | R | R | R | R |
|  | 11, DH0852-19 (p-type 2.5e20, 0.5 μm) | WO | O | R | R | R | R |
|  | 12, BQ0555-06 (n-type 7e18), 2 μm | R | R | R | R | R | R |
| Pt(20):Ti(80) | 13, DH0852-17 (p-type 2e19, 3.1 μm) | R | R | R | R | R | R |
|  | 14, DH0852-12 (p-type 7e19, 2 μm) | R | R | R | R | R | R |
|  | 15, DH0852-19 (p-type 2.5e20, 0.5 μm) | R | R | R | R | R | R |
|  | 16, BQ0555-06 (n-type 7e18), 2 μm | R | R | R | R | R | R |

Legend: R=Rectifying; O=Ohmic; WO=Weakly Ohmic

| Sample | 900 °C | 1000 °C | 1100 °C | 1150 °C | 1200 °C |
|---|---|---|---|---|---|
| BQ0339-08 (n-epilayer 5x10$^{18}$ cm$^{-3}$) | Ohmic | Ohmic | | | |
| BQ0154-07 (2μm p-epi >2E19) | | | Ohmic | Ohmic | Ohmic |

Qualitative electrical comparison of rapid thermal annealed Pt$_2$Si-Ti$_5$Si$_3$ on a n- and a p-type 4H-SiC RTA time = 5 s; vac.

| Sample | 900 °C | 1000 °C | 1100 °C | 1150 °C | 1200 °C |
|---|---|---|---|---|---|
| BQ0339-08 (n-epilayer 5x10$^{18}$ cm$^{-3}$) | Ohmic | Ohmic | Ohmic | Ohmic | Ohmic |
| BQ0154-07 (2μm p-epi >2E19) | | | Rect. | Ohmic | N/A |

Furnace anneal time = 30 min; Argon flow = 5 slpm

FIG. 9

Furnace anneal time = 30 min; Ar flow = 5 slpm

| Sample | 900 C | 1000 C | 1100 C | 1200 C |
|---|---|---|---|---|
| n-L (n-epi 5.3E18) | Ohmic | Ohmic | Ohmic | Ohmic |
| n-M (n-epi 1.4E19) | Ohmic | Ohmic | Ohmic | Ohmic |
| n-H (n-epi >2E19) | Ohmic | Ohmic | Ohmic | Ohmic |
| C3a-L (p-epi 5E18) | Rectifying | Rectifying | Weakly Ohmic | Weak Ohmic |
| Q8b-M (p-epi 1.7E19) | Rectifying | Rectifying | Weakly Ohmic | Weak Ohmic |
| A4c-H (p-epi >2E19) | Rectifying | Rectifying | Ohmic | Ohmic |

900

Qualitative electrical comparison of furnace annealed $Pt_2Si$-$Ti_5Si_3$ on n- and p-type 4H-SiC

SIMULTANEOUS OHMIC CONTACT TO SILICON CARBIDE

CROSS REFERENCE TO RELATED APPLICATION

This application is a non-provisional of, and claims priority to, U.S. Provisional Patent Application Ser. No. 61/883,419, which was filed Sep. 27, 2013. The subject matter of this earlier-filed application is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

FIELD

The present invention generally pertains to a simultaneous ohmic contact metallization, and in particular, to a process for producing a simultaneous ohmic contact metallization to n-type and p-type silicon carbide (SiC) semiconductor.

BACKGROUND

Conventional methods of fabricating ohmic contacts to bi-polar semiconductor devices require an exclusive application of one group of metallization on n-type contact areas of a device, and also require another group of metallization on p-type contact areas of the device. This characteristic is governed largely by the work function (WF) of the metal, relative to that of the semiconductor.

Theoretically, and in general, for n-type semiconductors, ohmic contact is accomplished when the WF of the metal is lower than the WF of the semiconductor. A Schottky barrier, or rectifying contact, is formed when the WF of the metal is greater than the WF of the n-type semiconductor. For p-type semiconductor, ohmic contact is achieved when the metal WF is greater than the WF of the semiconductor while a Schottky contact is formed, conversely.

The solid state physics of thermionic emission charge transport mechanism that supports the above conditions is not applicable in cases where the semiconductor, n-type or p-type, is degenerately doped, that is in cases when the impurity concentration is so high that the Fermi energy level is above the conduction band minimum or below the valence band maximum, respectively. Under such condition, the depletion width narrows, i.e., becomes electronically transparent, to allow charge tunneling that require minimum thermal energy. Under this condition, the exclusivity of the metal to form ohmic contact is removed and a broader range of metals can promote ohmic contact to either degenerately doped n-type or p-type semiconductors.

A bi-polar semiconductor device, such as a p-n junction device, is a building block for complex integrated circuits (IC) used in broad range of electronic applications. The bipolar semiconductor requires ohmic contacts to be formed on the n-type and p-type contact surfaces. Because mid to low impurity concentrations are needed to form a high performing bipolar device, it would require the exclusive use of a group of metals having lower WF, for the n-type surface, and the exclusive use of another group of metals with higher WF, for the p-type surface.

Conventionally, this requires multiple fabrication process steps with several masks to finally obtain the desired ohmic contacts. These steps include high temperature processing, photolithography, chemical etching, and others. The above batch of steps is repeated in order to finally obtain the ohmic contacts. The current processes are time consuming and complex. They are also characterized by high production costs, and the final device yield on the wafer is potentially reduced due to the large number of process steps.

In some cases, one of the layers is deliberately degenerately dope such that the metal ohmic contact exclusivity is removed, making it possible for broader range of metals to be ohmic on both n-type and p-type layers. One process of forming a degenerately doped layer in the contact area is by high energy ion implantation. This entails surface preparation prior to ion implantation, usually performed at temperatures over 1000 degrees Celsius. This process not only increases cost, but also induces damage to the lattice structure of the semiconductor. The induced damage can only be partially reversed after annealing. Post anneal ion implantation also required that the implant be activated at a temperature higher than 1200 degrees Celsius. It is also known that not all implants are fully activated even at 1200 degrees Celsius.

Thus, an alternative approach to solving this problem may be beneficial.

SUMMARY

Certain embodiments of the present invention may be implemented and provide solutions to the problems and needs in the art that have not yet been fully solved by conventional processes. For example, some embodiments of the present invention pertain to a method of formation of ohmic contact metallization simultaneously on n-type and p-type semiconductor SiC. More particularly, the ohmic contact can be formed on SiC layers having n-type and p-type doping through a single process step during the fabrication of the semiconductor device. Accordingly, the multiple process steps for fabricating contacts on to n-type and p-type surfaces can be greatly reduced, reducing time and cost, and increasing yield.

The embodiments further describe a metallization scheme that can serve as a non-discriminatory, universal ohmic contact to both n-type and p-type SiC. This can be accomplished without compromising the reliability of the specific contact resistivity when operated at temperatures in excess of 600° C.

In one embodiment, an apparatus includes a ratio mixture of platinum (Pt) and titanium (Ti) thin film metallization configured to simultaneously form ohmic contact to n-type and p-type SiC semiconductor.

In another embodiment, an apparatus includes a mixture of platinum, titanium, and silicon compounds deposited on a silicon carbide substrate. The silicon carbide substrate includes an n-type surface and a p-type surface.

In yet another embodiment, a method includes co-depositing platinum and titanium on an epitaxial layer of a substrate, and etching patterns in a metal mask deposited on the co-deposited platinum and titanium

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 1B illustrates a SiC substrate comprising a final pattern of a co-deposited Pt—Ti metal contact, according to an embodiment of the present invention.

FIG. 1C illustrates a result of rapid thermal anneal or furnace annealing on a SiC substrate, according to an embodiment of the present invention.

FIG. 3 is a graph illustrating a resistance versus distance between contacts on an n-type epilayer mesa, according to an embodiment of the present invention.

FIG. 4 is table illustrating a summary of the results obtained from various ratios of annealed Pt:Ti contact metallization, according to an embodiment of the present invention.

FIG. 5 is a table illustrating a result of rapid thermal annealing, according to an embodiment of the present invention.

FIG. 7 is table illustrating results of furnace annealing, according to an embodiment of the present invention.

FIG. 9 is a table illustrating results of another set of experiment using $Pt_2Si$—$Ti_5Si_3$, according to an embodiment of the present invention.

DETAILED DESCRIPTION OF THE EMBODIMENTS

Embodiments of the present invention pertain to a metal mixture or compound that is simultaneously ohmic on an n-type and p-type silicon carbide (SiC) semiconductor. This type of semiconductor fabrication process may eliminate multiple processes associated with the conventional processes described above.

Figure 1A:
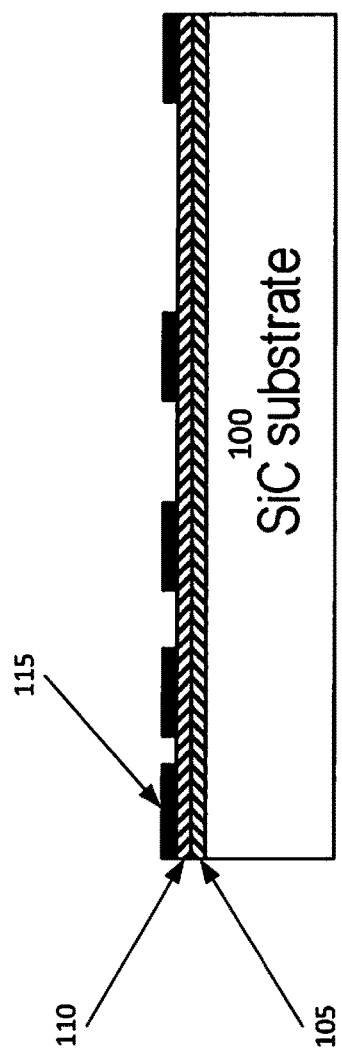
FIG. 1A illustrates a SiC substrate comprising co-deposition of platinum (Pt) and titanium (Ti) on an n-type or p-type epitaxial layer, according to an embodiment of the present invention.

FIG. 1A illustrates a SiC substrate 100 comprising co-deposition 110 of platinum (Pt) and titanium (Ti) on an n-type or p-type epitaxial layer 105, according to an embodiment of the present invention. In this embodiment, co-deposition 110 of platinum (Pt) and titanium (Ti) is accomplished through sputtering on epitaxial layer 105 of n-type or p-type SiC semiconductor 100. A metal mask 115 may be deposited for etching patterns.

FIG. 1B illustrates a SiC substrate 100 comprising a final pattern of co-deposited Pt—Ti metal contact 110, according to an embodiment of the present invention. In this embodiment, the final pattern is achieved after etching and stripping of metal mask 115.

FIG. 1C illustrates a result of rapid thermal or furnace annealing on a SiC substrate, according to an embodiment of the present invention. In this embodiment, the result of rapid thermal or furnace annealing of the co-sputtered Pt:Ti contact metallization 110 is shown.

It should be appreciated that in some embodiments, a mixture of platinum (Pt), titanium (Ti), and silicon (Si) compounds may be deposited on a SiC substrate 100, which includes n-type and p-type surfaces 105. Deposition of the mixed compound (or compound metallization) can be accomplished through sputtering, e-beam, co-sputtering, etc. The deposited compound may then be patterned and etched using dry or wet etching chemistry, followed by annealing at a high temperature (e.g., 1200 degrees Celsius) to create ohmic contact on both surfaces of different conductivities. Annealing can be accomplished by the use of a furnace or rapid thermal processes in some embodiments.

Co-Sputtered Platinum and Titanium Metallization

Figure 2:
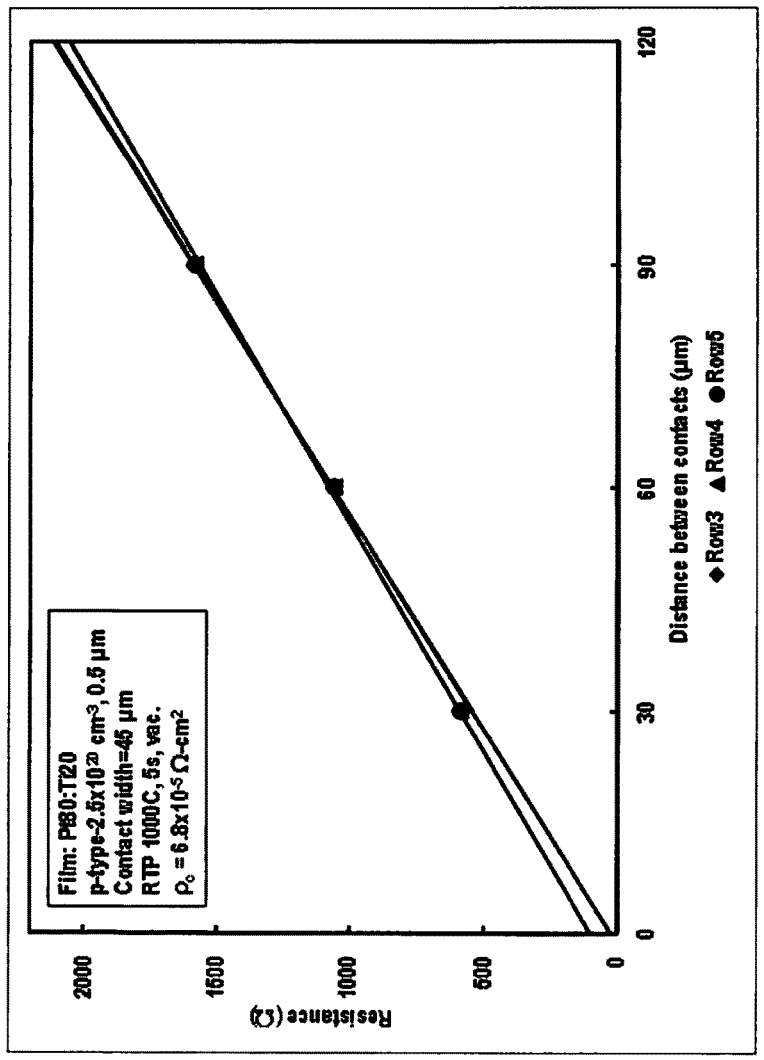
FIG. 2 is a graph illustrating resistances versus distance between contacts on a p-type epilayer mesa, according to an embodiment of the present invention.

FIG. 2 is a graph 200 illustrating resistances versus distance between contacts, according to an embodiment of the present invention. In particular, graph 200 shows a resistance versus distance between the contacts for the annealed Pt:Ti layer on p-type transmission line mesa etched in SiC epitaxial layer ($N_a$=2.5×10$^{20}$ cm$^{-3}$). In graph 200, the extracted average specific contact resistivity is 6.8×10$^{-5}$ $\Omega$-cm$^2$.

FIG. 3 is a graph 300 illustrating a resistance versus distance between contacts, according to an embodiment of the present invention. In particular, graph 300 shows a resistance versus distance between contacts for annealed Pt:Ti layer on n-type transmission line mesa etched in SiC epitaxial layer ($N_d$=7×10$^{18}$ cm$^{-3}$). In this embodiment, the extracted average specific contact resistivity is 1.3×10$^{-4}$ $\Omega$-cm$^2$.

FIG. 4 is table 400 illustrating a summary of the results obtained from various ratios of annealed Pt:Ti contact metallization, according to an embodiment of the present invention. In particular, table 400 illustrates the formation of simultaneous ohmic contacts to p-type and n-type SiC with the Pt(80):Ti(20) ratio.

The above description relates to the embodiment of the invention pertaining to the mixture of Pt and Ti in a ratio that is predetermined to produce simultaneous ohmic contact to p-type and n-type SiC, as illustrated in FIGS. 2 and 3. In some embodiments, sample 3 in table 400 may show that p-type epilayer DH0852-19 may be ohmic as it is degenerately doped. However, in other embodiments, the contacts on samples 11 and 15 of table 400 are not ohmic, thus indicating that the layer is not degenerately doped.

Alloyed $Pt_2Si$—$Ti_5Si_3$ Metallization

In a further embodiment, alloyed PtSi—TiSi$_2$ may be deposited onto an n-type and p-type SiC to obtain simultaneous ohmic contacts. This may allow for a stable sensor operation at temperatures above 600 degrees Celsius. In one embodiment, $Pt_2Si$—$Ti_5Si_3$ is deposited on n-type and p-type SiC samples using the deposition process similar to that described in, for example, FIGS. 1A-1C. A first set of samples is annealed by rapid thermal processing (RTP) at 900, 1000, 1100, 1200 degrees Celsius for 5 seconds in near vacuum. Another set of samples was furnace annealed at fixed Argon flow rate with temperatures at 900, 1000, 1100, and 1200 degrees Celsius. The results are then compared.

Rapid Thermal Anneal

FIG. 5 is a table 500 illustrating a result of rapid thermal annealing, according to an embodiment of the present invention. In this embodiment, for the n-type sample ($N_d$=5×10$^{18}$ cm$^{-3}$), electrically, the as-deposited metallization was ohmic. Table 500 shows that the samples annealed at 900, 1000, 1150, and 1200° C. were ohmic. For the p-type samples ($N_a$>2×10$^{19}$ cm$^{-3}$), the contacts annealed at 1100, 1150, and 1200 C were ohmic.

Figure 6A:
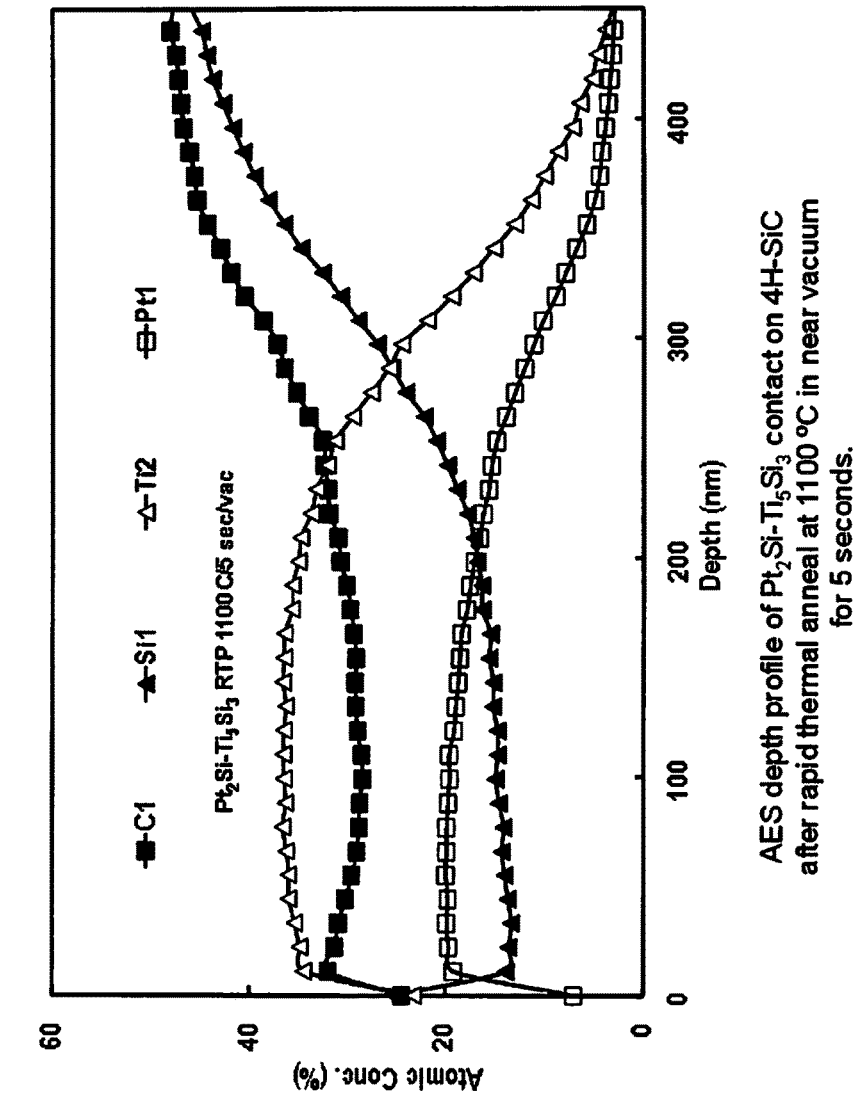
FIG. 6A is graph illustrating a presence of compounds of platinum (Pt) and titanium (Ti) at the SiC interface, according to an embodiment of the present invention.
Figure 6B:
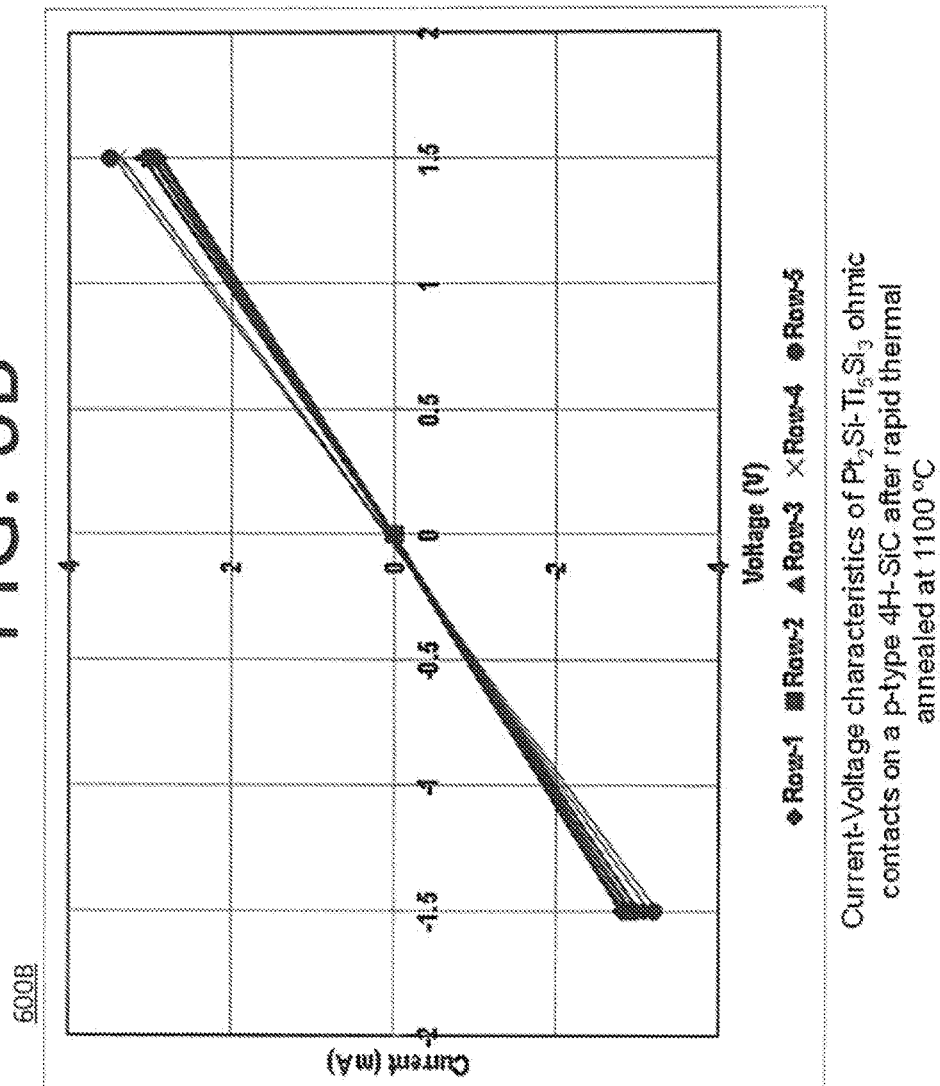
FIG. 6B is a graph illustrating current-voltage characteristics on a p-type SiC epilayer, according to an embodiment of the present invention.

FIG. 6A is graph 600A illustrating a presence of compounds of platinum (Pt) and titanium (Ti) at the SiC interface, according to an embodiment of the present invention. In this embodiment, a representative Auger Electron Spectroscopy (AES) in FIG. 6A shows the presence of platinum (Pt) and titanium (Ti) and the appropriate silicide and carbide compounds at the SiC interface. The Focused Ion Beam Scanning Electron Microscopy (FIB-SEM) of the cross section may show hexagonal, triangular, and elongated geometrical features of TiC crystallites, which are bounded by PtSi. FIG. 6B is a graph 600B illustrating current-voltage characteristics on a p-type SiC epilayer, according to an embodiment of the present invention. In particular, graph 600B shows current-voltage characteristics of the sample after rapid thermal annealing, confirming a linear relationship.

Furnace Anneal

FIG. 7 is table 700 illustrating results of furnace annealing, according to an embodiment of the present invention. In this embodiment, the furnace anneal time is 30 minutes and the Argon flow condition of 5 slpm. For an n-type sample ($N_d$=5×10$^{18}$ cm$^{-3}$), electrically, the as-deposited metallization appears to be ohmic. Samples annealed at 900, 1000, 1150, and 1200° C. are ohmic. For the p-type samples ($N_a$>2×10$^{19}$ cm$^{-3}$), ohmic contact is obtained when annealed at 1150 C. The sample annealed at 1200 C does not appear to be of good quality to determine its electrical characteristics.

Figure 8:
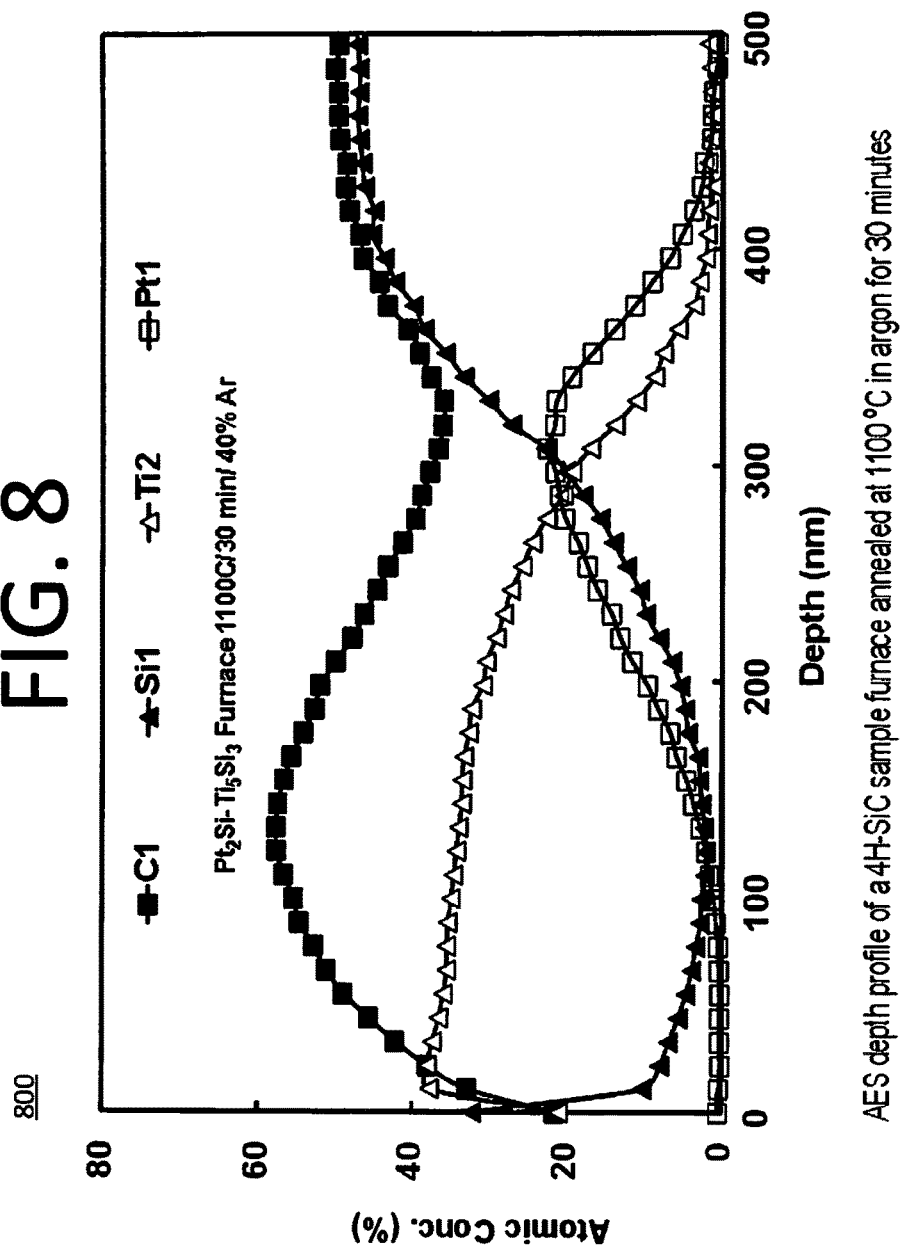
FIG. 8 is a graph illustrating the presence of compounds of platinum (Pt) and titanium (Ti) at the interface of a 4H—SiC furnace annealed sample, according to an embodiment of the present invention.

FIG. 8 is a graph 800 illustrating the presence of compounds of platinum (Pt) and titanium (Ti) at the surface of a 4H—SiC furnace annealed sample, according to an embodiment of the present invention. In particular, FIG. 8 shows the presence of platinum (Pt) and titanium (Ti) and their appropriate silicide and carbide compounds at the SiC interface. The FIB-SEM of the cross section shows that at the SiC interface, $Pt_xSi_y$ appears to be the dominant layer while TiC and $Ti_5Si_3$ cannot be excluded.

FIG. 9 is a table 900 illustrating results of another set of experiment using $Pt_2Si$—$Ti_5Si_3$, according to an embodiment of the present invention. In particular, table 900 shows n-type and p-type samples furnace annealed at different temperatures for 30 minutes each with Argon flow condition of 5 slpm. For the n-type samples ($N_d$=5.3×10$^{18}$ cm$^{-3}$, 1.4×10$^{19}$ cm$^{-3}$, and >2×10$^{19}$ cm$^{-3}$), ohmic contact was obtained after 900, 1000, and 1200 C anneals. The p-type samples ($N_a$=5×10$^{18}$ cm$^{-3}$, and 1.7×10$^{19}$ cm$^{-3}$) were weakly ohmic after 1100 and 1200 C anneals. However, the sample doped at >2×10$^{19}$ cm$^{-3}$ was ohmic at these two temperatures.

In summary, embodiments of the present invention show that by a careful selection of the appropriate ratio of platinum (Pt) and titanium (Ti), or the alloy of platinum (Pt), titanium (Ti), and silicon (Si), metal carbides and silicides with dual work functions favoring simultaneous ohmic contact formation on both n-type and p-type surfaces have been demonstrated.

Electrical ohmic contacts may be simultaneously formed on SiC semiconductors having donor and acceptor impurities (n-type and p-type doping, respectively). This proves that such contacts can be formed on SiC layers in a single process step during the fabrication of the semiconductor device. This also means that the multiple process steps for fabricating contacts onto n-type and p-type surfaces, which is characteristic of the conventional method, will be greatly reduced. This will also reduce time and cost, and increase yield. It should be noted that the more process steps required, complexity increases chances for lower yields.

In another embodiment, the process serves as a non-discriminatory, universal ohmic contact to both n-type and p-type SiC, without compromising the reliability of the specific contact resistivity when operated at temperatures in excess of 600° C.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that embodiments of the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
   a silicon carbide semiconductor comprising an n-type surface and a p-type surface; and
   a mixture of platinum and titanium configured to simultaneously form an ohmic contact to both the n-type surface and the p-type surface, wherein the mixture does not include aluminum and has at least 30 atomic % platinum.

2. The apparatus of claim 1, wherein the mixture of platinum and titanium is deposited on an epitaxial layer including both the n-type surface and the p-type surface.

3. The apparatus of claim 2, wherein the mixture of platinum and titanium is deposited through sputtering on the epitaxial layer.

4. The apparatus of claim 1, further comprising:
   a metal mask deposited on the mixture of platinum and titanium, and configured to be etched with patterns on the mixture of platinum and titanium.

5. The apparatus of claim 4, wherein the metal mask is configured to be etched and stripped to obtain a final pattern of the mixture of platinum and titanium.

6. The apparatus of claim 1, wherein the mixture of platinum and titanium is configured to be annealed to form an annealed mixture of platinum and titanium contact metallization on both the n-type and p-type surfaces.

7. An apparatus, comprising:
   a mixture of platinum, titanium, and silicon compounds deposited on a silicon carbide substrate, wherein:
   the mixture does not include aluminum;
   the mixture has a greater atomic percentage of platinum than titanium;
   the silicon carbide substrate comprises an n-type surface and a p-type surface; and
   the mixture of platinum, titanium, and silicon compounds is configured to simultaneously form an ohmic contact to both the n-type surface and the p-type surface.

8. The apparatus of claim 7, wherein the mixture of platinum, titanium, and silicon compounds is deposited on the silicon carbide substrate through sputtering, e-beam, or co-sputtering.

9. The apparatus of claim 7, wherein the mixture of platinum, titanium, and silicon compounds is patterned and etched using dry or wet chemistry.

10. The apparatus of claim 7, wherein the mixture of platinum, titanium, and silicon compounds are annealed at a high temperature to create ohmic contact on the n-type surface and the p-type surface.

11. The apparatus of claim of 10, wherein the n-type surface and the p-type surface comprise different conductivities.

12. The apparatus of claim 10, wherein the mixture of platinum, titanium, and silicon compounds is annealed through a furnace annealing or rapid thermal annealing.

13. A method, comprising:
    depositing a mixture of platinum and titanium on an epitaxial layer of a substrate, wherein the epitaxial layer has a substantially planar deposition surface having a n-type portion and a p-type portion, wherein the mixture of platinum and titanium is simultaneously deposited on both the n-type portion and the p-type portion;
    forming an ohmic contact to both the n-type portion and the p-type portion via the deposited mixture of platinum and titanium; and
    etching patterns in a metal mask deposited on the deposited mixture of platinum and titanium.

14. The method of claim 13, wherein the substrate comprises silicon carbide.

15. The method of claim 13, wherein the co-depositing of the platinum and titanium comprises sputtering the platinum and titanium on the epitaxial layer of the substrate.

16. The method of claim 13, further comprising:
    annealing at a high temperature the co-deposited platinum and titanium to create an ohmic contact on the n-type portion and the p-type portion.

17. The method of claim 16, wherein the annealing of the co-deposited platinum and titanium comprises furnace annealing of the co-deposited platinum and titanium.

18. The method of claim 16, wherein the annealing of the co-deposited platinum and titanium comprises rapid thermal annealing of the co-deposited platinum and titanium.

19. The method of claim 13, further comprising:
    stripping the metal mask to produce a final pattern on the epitaxial layer of the substrate.

* * * * *